United States Patent
Phichej (10) Patent No.: US 10,396,777 B2
(45) Date of Patent: Aug. 27, 2019

(54) ORING CIRCUIT (71) Applicant: Delta Electronics (Thailand) Public Company Limited, Samutprakarn (TH)

(72) Inventor: Cheevanantachai Phichej, Samutprakarn (TH)

(73) Assignee: DELTA ELECTRONICS (THAILAND) PUBLIC COMPANY LIMITED, Samutprakarn (TH)

(*) Notice: Subject to any disclaimer, the term of this patent is extended or adjusted under 35 U.S.C. 154(b) by 0 days.

(21) Appl. No.: 15/915,718

(22) Filed: Mar. 8, 2018

(65) Prior Publication Data
US 2019/0181852 A1 Jun. 13, 2019

Related U.S. Application Data (60) Provisional application No. 62/598,107, filed on Dec. 13, 2017.

(51) Int. Cl.
*H03K 17/16* (2006.01)
*H03K 5/24* (2006.01)
*H03K 17/687* (2006.01)

(52) U.S. Cl.
CPC .......... *H03K 17/161* (2013.01); *H03K 5/24* (2013.01); *H03K 17/687* (2013.01)

(58) Field of Classification Search
CPC ....... H03K 17/161; H03K 5/24; H03K 17/687
USPC ......................................................... 327/543
See application file for complete search history.

(56) References Cited

U.S. PATENT DOCUMENTS

| | | | |
|---|---|---|---|
| 6,301,133 B1 | 10/2001 | Cuadra et al. | |
| 7,038,433 B2 | 5/2006 | Fan et al. | |
| 7,498,778 B2 | 3/2009 | Seiersen | |
| 7,649,404 B2 | 1/2010 | Sikora et al. | |
| 9,614,365 B2 | 4/2017 | Tang et al. | |
| 10,014,851 B2 * | 7/2018 | Chauhan | G01R 19/0092 |

FOREIGN PATENT DOCUMENTS

| | | |
|---|---|---|
| CN | 102545868 A | 7/2012 |
| TW | I428613 B | 3/2014 |

* cited by examiner

*Primary Examiner* — John W Poos
(74) *Attorney, Agent, or Firm* — Kirton McConkie; Evan R. Witt (57) ABSTRACT

An ORing circuit is provided. The ORing circuit includes an input port, an output port, an ORing FET, a comparing circuit, a first transistor and a second transistor. The ORing FET is connected between the input port and the output port and comprises a source connected with the input port, a gate and a drain connected with the output port. The comparing circuit is connected with the input port and the gate. The first transistor comprises a first terminal, a second terminal and a third terminal. The first terminal is connected with the input port and the source, and the third terminal is connected with the gate. The second transistor comprises a fourth terminal, a fifth terminal and a sixth terminal. The fourth terminal is connected with the output port and the drain, and the sixth terminal is connected with the second terminal of the first transistor.

17 Claims, 8 Drawing Sheets

ORING CIRCUIT

CROSS-REFERENCE TO RELATED APPLICATION

This application claims the benefit of U.S. Provisional Application No. 62/598,107 filed on Dec. 13, 2017, and entitled "NON LINEAR MODE CONTROLLER FOR ORING FIELD EFFECT TRANSISTOR FOR HIGH EFFICIENCY REDUNDANT PSU", the entirety of which is hereby incorporated by reference.

FIELD OF THE DISCLOSURE

The present disclosure relates to an ORing circuit, and more particularly to an ORing circuit with an ORing FET operating in a nonlinear mode.

BACKGROUND OF THE DISCLOSURE

Nowadays, with the development of the electronic industry, the power supply system is widely used for power supply. The power supply system usually includes plural power supply units joined in parallel by a system bus. Accordingly, an ORing device with an isolation diode is provided to connect between each power supply unit and the system bus for blocking the reverse current from flowing back from the system bus to the power supply unit. Further, the isolation diode is replaced by an ORing FET (field effect transistor) for lower voltage drop across the ORing device.

Generally, the ORing FET operates in either a linear mode or a saturation mode. For the ORing FET operating in the linear mode, when the output current loading decreases to no load, the gate-source voltage almost remain at the gate-source threshold voltage level, which causes the drain-source resistance of the ORing FET to remain at highest value. Thus, if the output voltage provided to the system bus is higher than the input voltage received from the power supply unit, the negative current flowing back to the ORing FET is low. However, the drain-source resistance of the ORing FET is high at heavy load, which causes low efficiency on power transmission due to more power dissipated or heated over the ORing FET.

For the ORing FET operating in the saturation mode, the gate-source voltage of the ORing FET keeps at maximum value from no load to maximum load. At heavy load, the high gate-source voltage can get low drain-source resistance on the ORing FET, which causes high efficiency on power transmission. However, when the output current loading decreases to no load, the gate-source voltage remains at maximum value and the drain-source resistance of the ORing FET remains at minimum value. Thus, when the output voltage is higher than the input voltage, the negative current flowing back to the ORing FET is high.

Therefore, there is a need of providing an ORing circuit to obviate the drawbacks encountered from the prior arts.

SUMMARY OF THE DISCLOSURE

It is an object of the present disclosure to provide an ORing circuit. An ORing FET of the ORing circuit is connected between an input port and an output port of the ORing circuit, thus the current between the input port and output port is controlled by changing the state of the ORing FET. In addition, the ORing FET operates in a nonlinear mode. When the output current loading is at heavy load, the drain-source resistance of the ORing FET is low, which causes high efficiency on power transmission. When the output current loading is at no/light load, the drain-source resistance of the ORing FET is high, which causes low negative current flowing back to the ORing FET. Therefore, the negative current is limited by the high drain-source resistance of the ORing FET when the output voltage is higher than the input voltage. Furthermore, when the input port is shorted to ground, the comparing circuit turns off the ORing FET immediately to protect the output voltage from going to out of regulation.

In accordance with an aspect of the present disclosure, there is provided an ORing circuit. The ORing circuit includes an input port, an output port, an ORing FET, a comparing circuit, a first transistor and a second transistor. The input port is for receiving an input voltage. The output port is for outputting an output voltage. The ORing FET is electrically connected between the input port and the output port and comprises a source, a gate and a drain. The source of the ORing FET is electrically connected with the input port, and the drain of the ORing FET is electrically connected with the output port. The comparing circuit is electrically connected with the input port and the gate of the ORing FET. The first transistor comprises a first terminal, a second terminal and a third terminal. The first terminal is electrically connected with the input port and the source of the ORing FET, and the third terminal is electrically connected with the gate of the ORing FET. The second transistor comprises a fourth terminal, a fifth terminal and a sixth terminal. The fourth terminal is electrically connected with the output port and the drain of the ORing FET, the fifth terminal is connected to the sixth terminal, and the sixth terminal is electrically connected with the second terminal of the first transistor.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
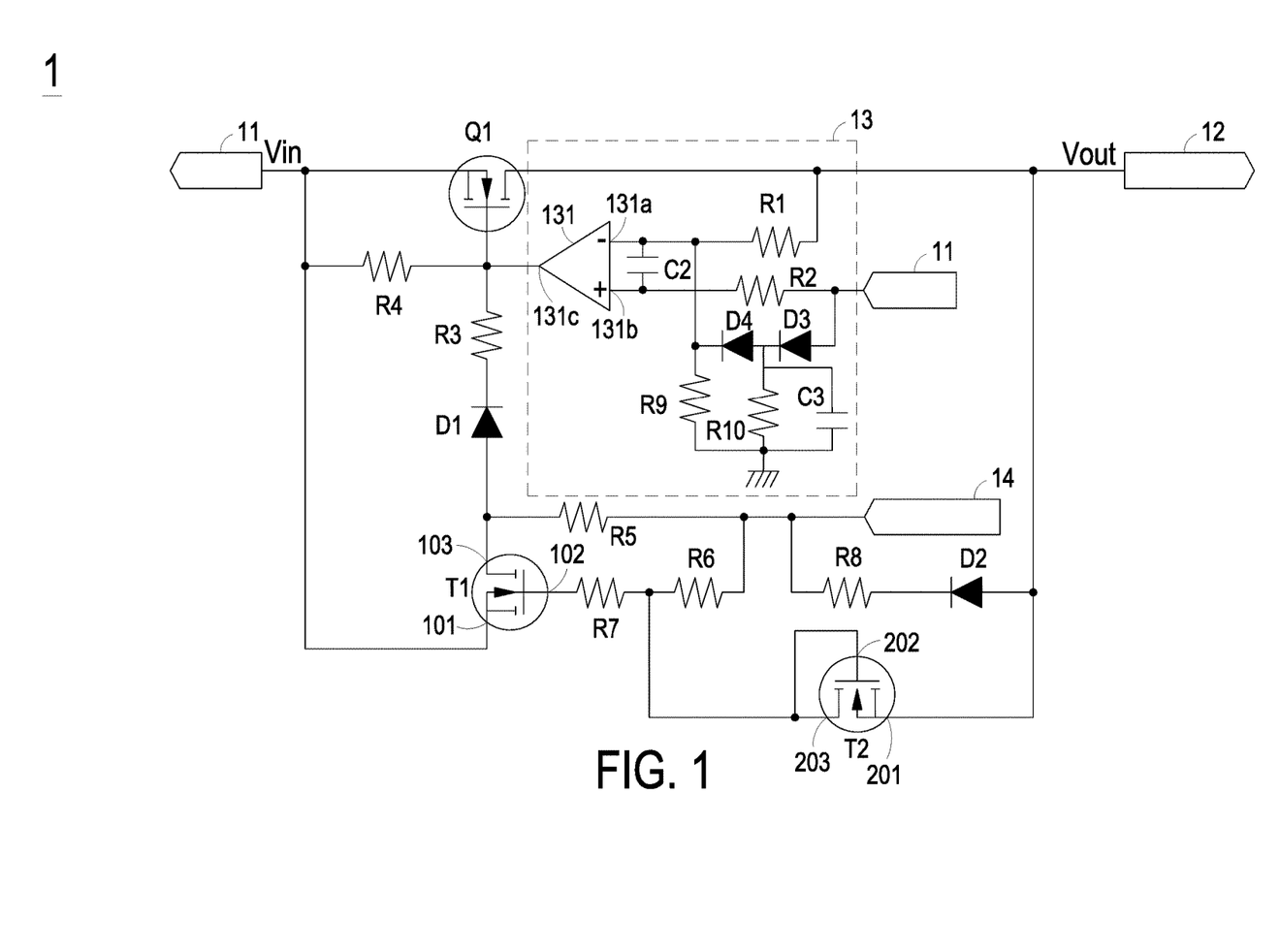
FIG. 1 is a schematic diagram illustrating an ORing circuit according to a first embodiment of the present disclosure.

FIG. 1 is a schematic diagram illustrating an ORing circuit according to a first embodiment of the present disclosure. As shown in FIG. 1, the ORing circuit 1 includes an input port 11, an output port 12, an ORing FET (field effect transistor) Q1, a comparing circuit 13, a first transistor T1 and a second transistor T2. The input port 11 is used for receiving an input voltage Vin, and the output port 12 is used for outputting an output voltage Vout. The ORing FET Q1 is electrically connected between the input port 11 and the output port 12, thus the current between the input port 11 and the output port 12 is controlled by changing the state of the ORing FET Q1. Meanwhile, when the output voltage Vout is higher than the input voltage Vin, the ORing circuit 1 can prevent the current from flowing back from the output port 12 to the input port 11. For example but not exclusively, the input port 11 is coupled to a power supply unit, and the output port 12 is coupled to a system bus (not shown). Under this circumstance, the ORing circuit 1 can prevent the current from flowing back from the system bus to the power supply unit.

The ORing FET (field effect transistor) Q1 includes a source, a gate and a drain. The source of the ORing FET Q1 is electrically connected with the input port 11, and the drain of the ORing FET Q1 is electrically connected with the output port 12.

The comparing circuit 13 is electrically connected with the input port 11 and the gate of the ORing FET Q1. In this embodiment, the comparing circuit 13 includes a comparator 131, a first resistance R1 and a second resistance R2. The comparator 131 has an inverting input 131a, a non-inverting input 131b and an output 131c. The inverting input 131a is electrically connected with one terminal of the first resistance R1, and the other terminal of the first resistance R1 is electrically connected with the output port 12 and the drain of the ORing FET Q1. The non-inverting input 131b of the comparator 131 is electrically connected with one terminal of the second resistance R2, and the other terminal of the second resistance R2 is electrically connected with the input port 11. The output 131c of the comparator 131 is electrically connected with the gate of the ORing FET Q1.

The first transistor T1 includes a first terminal 101, a second terminal 102 and a third terminal 103. The first terminal 101 is electrically connected with the input port 11 and the source of the ORing FET Q1, and the third terminal 103 is electrically connected with the gate of the ORing FET Q1.

The second transistor T2 includes a fourth terminal 201, a fifth terminal 202 and a sixth terminal 203. The fourth terminal 201 is electrically connected with the output port 12 and the drain of the ORing FET Q1, the fifth terminal 202 is connected to the sixth terminal 203, and the sixth terminal 203 is electrically connected with the second terminal 102 of the first transistor T1. In an embodiment, the first transistor T1 and the second transistor T2 are for example but not limited to be contained in a 6-pin SOT-363 (small-outline transistor 363) package or in two 3-pin SOT-23 (small-outline transistor 23) packages respectively.

The ORing FET Q1 is selectively biased based on the difference between the input voltage Vin and the output voltage Vout. When the output voltage Vout is higher than the input voltage Vin, the ORing FET Q1 is held in off mode for isolation so as to prevent the current from flowing back. When the output voltage Vout is lower than the input voltage Vin, the ORing FET Q1 is held in on mode for allowing the current to flow between the input port 11 and the output port 12.

In operation, when the output voltage Vout is higher than the input voltage Vin, the output voltage Vout causes less current passing through the second transistor T2, which causes the second transistor T2 to turn off. After the second transistor T2 goes to the off mode, all the bias passing through the second transistor T2 changes flow direction to the second terminal 102 of the first transistor T1. As the second terminal 102 of the first transistor T1 receives more bias voltage/current level, the first transistor T1 goes to the saturation mode. Since the first transistor T1 is in the saturation mode, the output from the third terminal 103 of the first transistor T1 goes down, which controls the gate-source voltage of the ORing FET Q1 to become lower than that in initial state. Therefore, the low gate-source voltage of the ORing FET Q1 makes the ORing FET Q1 be in high drain-source resistance, so that the current flowing back from the output port 12 to the input port 11 is limited.

In addition, if the input port 11 is shorted to ground, the ORing FET Q1 must turn off as fast as possible so as to avoid the output voltage Vout going down to zero due to the low drain-source resistance of the ORing FET Q1. In this case, the ORing FET Q1 is turned off by the comparator 131 of the comparing circuit 13. When the input port 11 is shorted to ground, the input voltage Vin goes down to zero immediately, and the comparator 131 forces the gate-source voltage of the ORing FET Q1 to zero for achieving high drain-source resistance immediately. Consequently, the comparing circuit 13 can protect the output voltage Vout from going to out of regulation.

Alternatively, when the output voltage Vout is lower than the input voltage Vin, more current passes through the second transistor T2, and higher bias passes to the second transistor T2. Afterward, the second transistor T2 sinks more bias current from the second terminal 102 of the second terminal 102 of the first transistor T1. As the second terminal 102 of the first transistor T1 gets less bias, the third terminal 103 of the first transistor T1 goes to high voltage level, which makes the gate-source voltage of the ORing FET Q1 go to high voltage level. Accordingly, the drain-source resistance of the ORing FET Q1 becomes low, which supports more voltage transmitted to the output port 12.

Consequently, the negative current flowing back to the ORing FET Q1 is limited by the high drain-source resistance of the ORing FET Q1 when the output voltage Vout is higher than the input voltage Vin. Moreover, when the input port 11 is shorted to the ground, the comparing circuit 13 turns off the ORing FET Q1 immediately to protect the output voltage Vout from going to out of regulation. In addition, the drain-source resistance of the ORing FET Q1 is low when the output voltage Vout is lower than the input voltage Vin. Thus, the loss of the ORing FET Q1 is low, which causes high efficiency on power transmission. For the case that the input port 11 and the output port 12 of the ORing circuit 1 are coupled to the power supply unit and the system bus respectively, the efficiency on power supply is enhanced.

Figure 2:
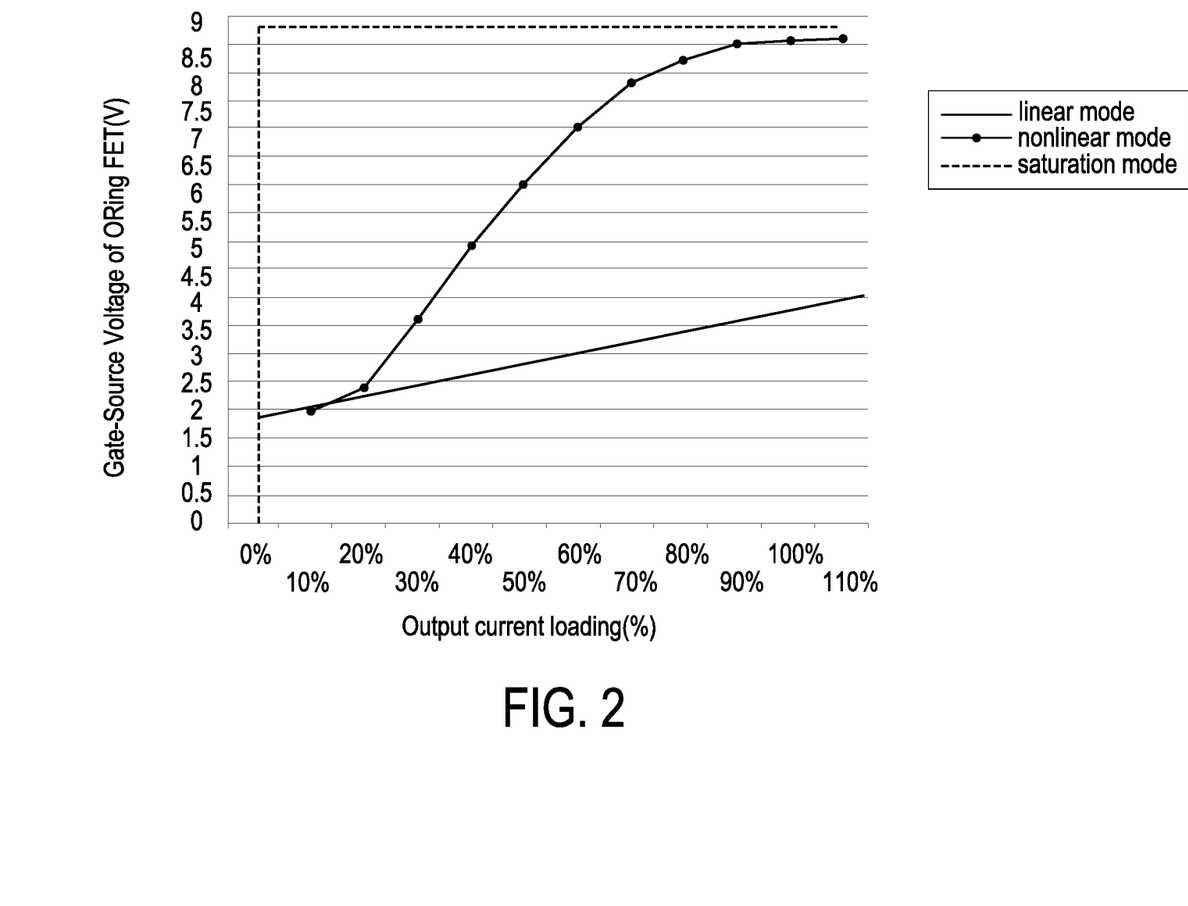
FIG. 2 is a schematic graph showing the gate-source voltage of the ORing FET versus the output current loading curves of the ORing FETs operating in the linear mode, the nonlinear mode and the saturation mode.
Figure 3:
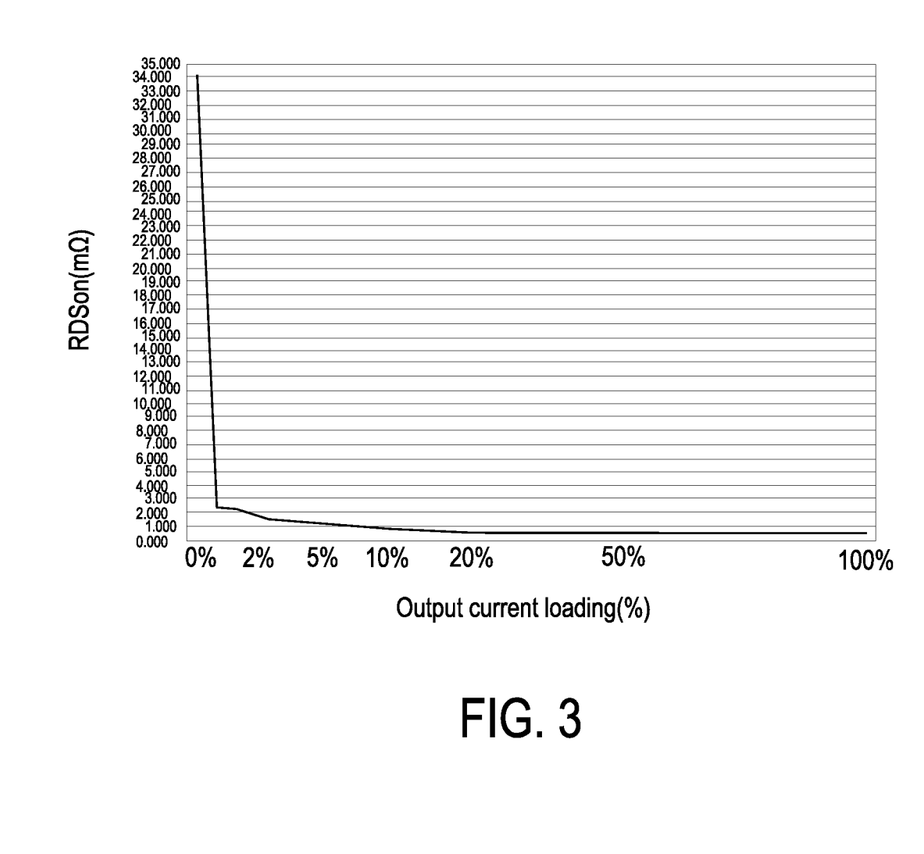
FIG. 3 is a schematic graph showing the drain-source resistance of the ORing FET operating in the nonlinear mode versus the output current loading curve.

FIG. 2 is a schematic graph showing the gate-source voltage of the ORing FET versus the output current loading curves of the ORing FETs operating in the linear mode, the nonlinear mode and the saturation mode, and FIG. 3 is a schematic graph showing the drain-source resistance of the ORing FET operating in the nonlinear mode versus the output current loading curve. As shown in FIG. 2, the three curves with different shapes of line represents the gate-source voltage of the ORing FET versus output current loading curves of the inventive ORing FET Q1 operating in the nonlinear mode and the conventional ORing FET operating in the linear mode and the saturation mode respectively. It is noted that the gate-source voltage of the ORing FET Q1 operating in the nonlinear mode varies obviously with the change of the output current loading. At heavy load, the gate-source voltage of the ORing FET Q1 operating in the nonlinear mode is as high as that of the ORing FET operating in the saturation mode. At no/light load, the gate-source voltage of the ORing FET Q1 operating in the nonlinear mode is as low as that of the ORing FET operating in the linear mode, which is equal to the gate-source threshold voltage. Since the gate-source voltage and the drain-source resistance of the ORing FET are in inverse proportion, the drain-source resistance of the ORing FET Q1 is affected by the gate-source voltage of the ORing FET Q1 accordingly. As shown in FIG. 3, the RDSon (drain-source resistance) of the ORing FET Q1 is low at heavy load, and the RDSon of the ORing FET Q1 is high at no/light load. The low RDSon of the ORing FET Q1 at heavy load allows more current passing through the ORing FET Q1, and the high RDSon of the ORing FET Q1 at no/light load allows the ORing FET Q1 to prevent the current from flowing back when the output voltage Vout is higher than the input voltage Vin. In addition, the RDSon of the ORing FET Q1 remains low at most loading conditions, which causes high efficiency on power transmission. Compared with the conventional ORing FETs operating in the linear mode and the saturation mode, the ORing FET Q1 operating in the nonlinear mode of the present disclosure possesses the advantages of the ORing FETs operating in the linear mode and the saturation mode and obviates the drawbacks thereof. Namely, the ORing FET Q1 operating in the nonlinear mode of the present disclosure can cover all of the operation in high efficiency and effectively prevent the negative current from flowing back to the input port 11 of the ORing circuit 1.

Please refer to FIG. 1 again. In an embodiment, the ORing circuit 1 further includes a first diode D1, a third resistance R3 and a fourth resistance R4. An anode pin of the first diode D1 is electrically connected with the third terminal 103 of the first transistor T1, a cathode pin of the first diode D1 is electrically connected with one terminal of the third resistance R3, and the other terminal of the third resistance R3 is electrically connected with the gate of the ORing FET Q1. One terminal of the fourth resistance R4 is electrically connected with the input port 11 and the source of the ORing FET Q1, and the other terminal of the fourth resistance R4 is electrically connected with the gate of the ORing FET Q1.

In an embodiment, the ORing circuit 1 further includes a bias port 14, a fifth resistance R5, a sixth resistance R6, a seventh resistance R7, an eighth resistance R8 and a second diode D2. The bias port 14 is used for receiving a bias voltage. One terminal of the fifth resistance R5 is electrically connected with the third terminal 103 of the first transistor T1, and the other terminal of the fifth resistance R5 is electrically connected with the bias port 14. One terminal of the sixth resistance R6 is electrically connected with the bias port 14, the other terminal of the sixth resistance R6 is electrically connected with one terminal of the seventh resistance R7 and the sixth terminal 203 of the second transistor T2, and the other terminal of the seventh resistance R7 is electrically connected with the second terminal 102 of the first transistor T1. An anode pin of the second diode D2 is electrically connected with the output port 12, the drain of the ORing FET Q1 and the fourth terminal 201 of the second transistor T2, a cathode pin of the second diode D2 is electrically connected with one terminal of the eighth resistance R8, and the other terminal of the eighth resistance R8 is electrically connected with the bias port 14.

In an embodiment, the comparing circuit 13 of the ORing circuit 1 further includes a second capacitance C2, a third capacitance C3, a third diode D3, a fourth diode D4, a ninth resistance R9 and a tenth resistance R10. Two terminals of the second capacitance C2 are electrically connected with the inverting input 131a and the non-inverting input 131b of the comparator 131 respectively. The third diode D3 is connected with the fourth diode D4 in series, an anode pin of the third diode D3 is electrically connected with the input port 11, and a cathode pin of the fourth diode D4 is electrically connected with the inverting input 131a of the comparator 131. One terminal of the ninth resistance R9 is electrically connected with the inverting input 131a of the comparator 131, and the other terminal of the ninth resistance R9 is grounded. One terminal of the tenth resistance R10 is electrically connected with a cathode pin of the third diode D3 and an anode pin of the fourth diode D4, and the other terminal of the tenth resistance R10 is grounded. The third capacitance C3 is connected with the tenth resistance R10 in parallel.

Figure 4:
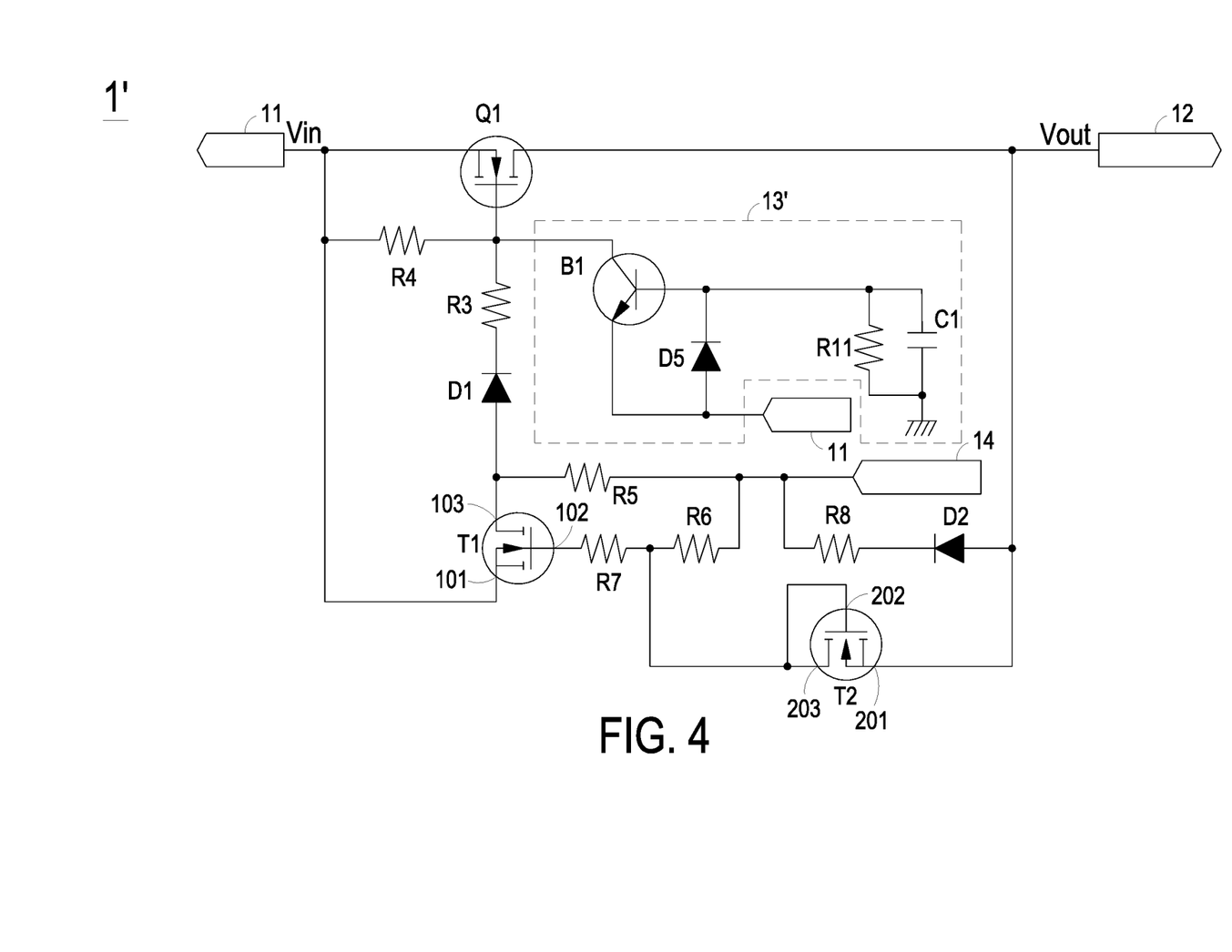
FIG. 4 is a schematic diagram illustrating an ORing circuit according to a second embodiment of the present disclosure.

FIG. 4 is a schematic diagram illustrating an ORing circuit according to a second embodiment of the present disclosure. The circuit elements similar to that of FIG. 1 are designated by identical numeral references, and are not redundantly described herein. As shown in FIG. 4, the ORing circuit 1' includes an input port 11, an output port 12, an ORing FET Q1, a comparing circuit 13', a first transistor T1 and a second transistor T2. In this embodiment, the comparing circuit 13' includes a first BJT (bipolar junction transistor) B1, a first capacitance C1, a fifth diode D5 and an eleventh resistance R11. The first BJT B1 includes a collect, a base and an emitter. The collect of the first BJT B1 is electrically connected with the gate of the ORing FET Q1, the base of the first BJT B1 is electrically connected with the grounded first capacitance C1, and the emitter of the first BJT B1 is electrically connected with the input port 11. An anode pin of the fifth diode D5 is connected with the input port 11 and the emitter of the first BJT B1, and a cathode pin of the fifth diode D5 is connected with the base of the first BJT B1. The eleventh resistance R11 is connected with the first capacitance C1 in parallel. In this embodiment, when the input port 11 is shorted to ground, the ORing FET Q1 is turned off by the first BJT B1 of the comparing circuit 13'.

Figure 5:
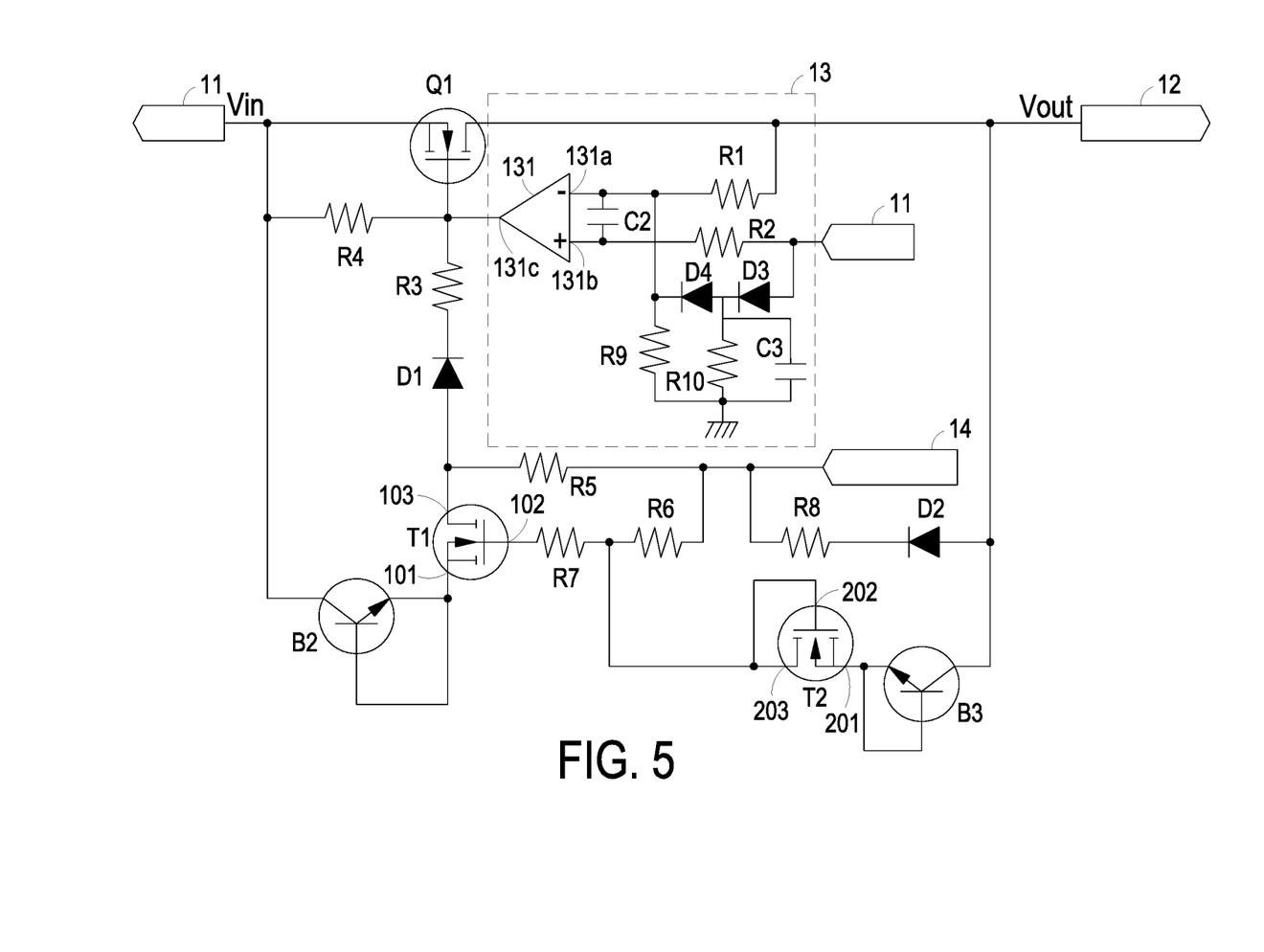
FIG. 5 is a schematic diagram illustrating a variant example of the ORing circuit according to the first embodiment of the present disclosure.
Figure 6:
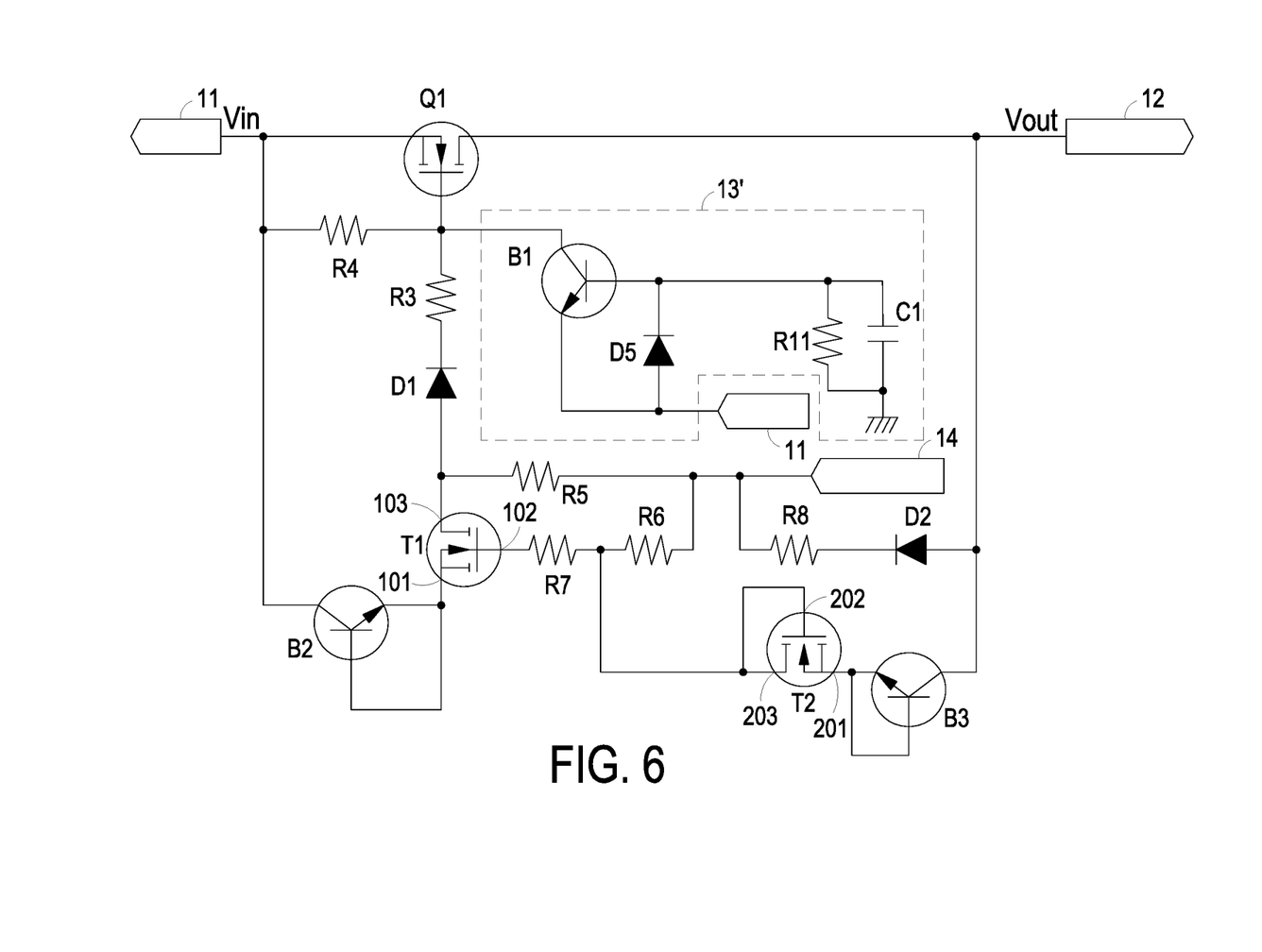
FIG. 6 is a schematic diagram illustrating a variant example of the ORing circuit according to the second embodiment of the present disclosure.
Figure 7:
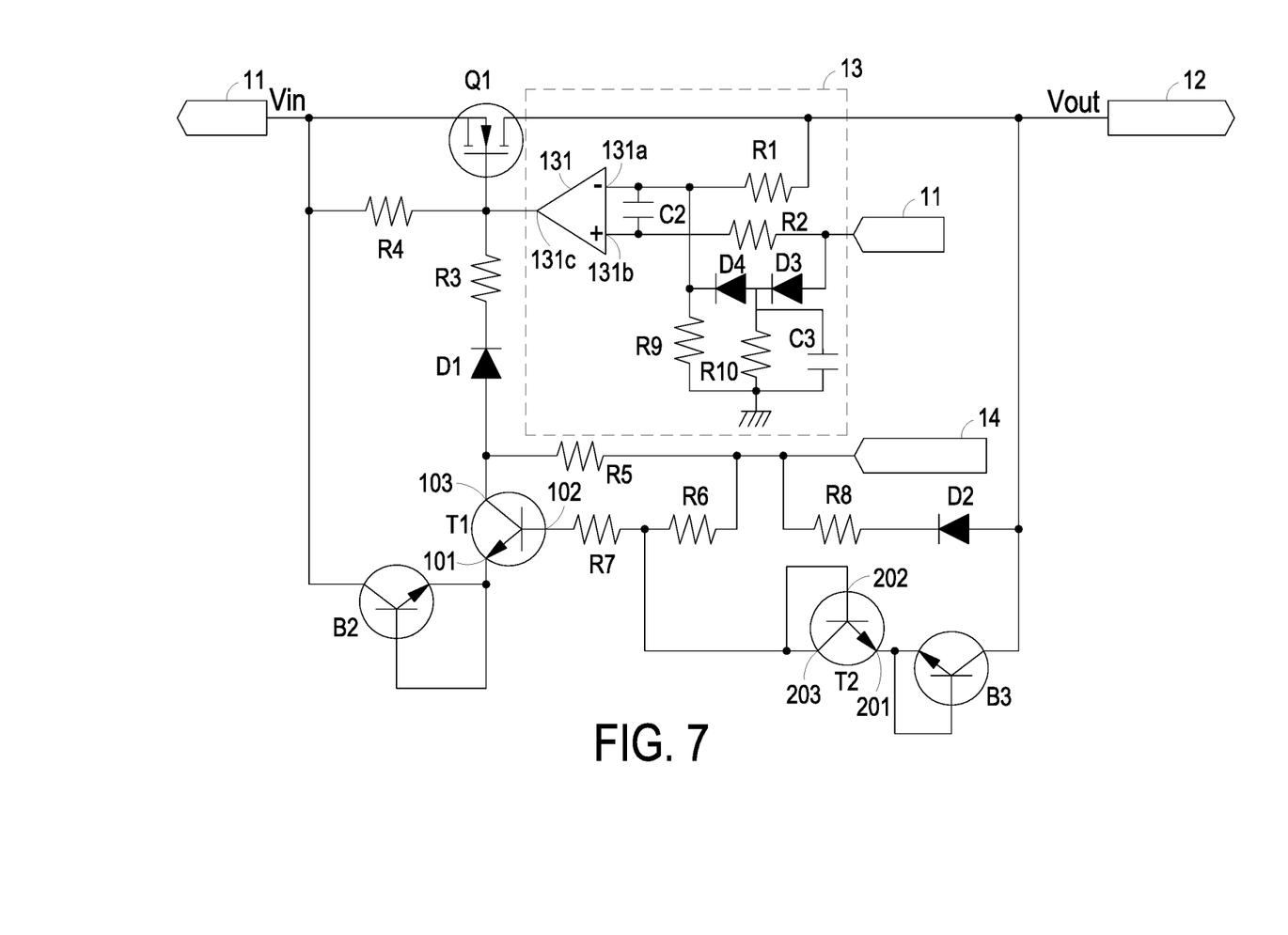
FIG. 7 is a schematic diagram illustrating another variant example of the ORing circuit according to the first embodiment of the present disclosure.
Figure 8:
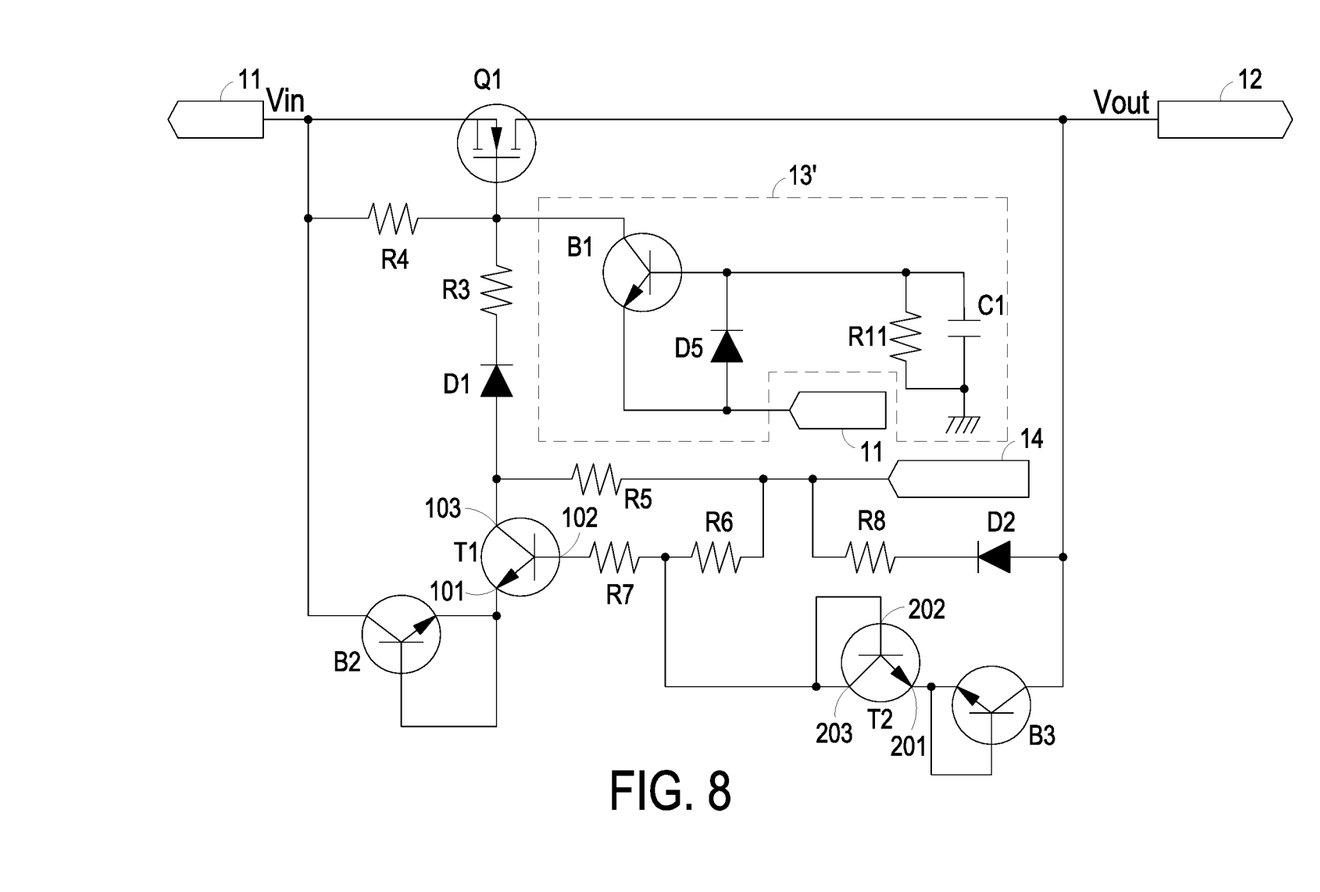
FIG. 8 is a schematic diagram illustrating another variant example of the ORing circuit according to the second embodiment of the present disclosure.

FIG. 5 is a schematic diagram illustrating a variant example of the ORing circuit according to the first embodiment of the present disclosure, and FIG. 6 is a schematic diagram illustrating a variant example of the ORing circuit according to the second embodiment of the present disclosure. In some embodiments, as shown in FIGS. 5 and 6, the ORing circuit (1, 1') further includes a second BJT B2 and a third BJT B3. The second BJT B2 includes a collect, a base and an emitter. The collect of the second BJT B2 is electrically connected with the input port 11 and the source of the ORing FET Q1, the base of the second BJT B2 is connected to the emitter of the second BJT B2, and the emitter of the second BJT B2 is electrically connected with the first terminal 101 of the first transistor T1. The third BJT B3 includes a collect, a base and an emitter. The collect of the third BJT B3 is electrically connected with the output port 12 and the drain of the ORing FET Q1, the base of the third BJT B3 is connected to the emitter of the third BJT B3, and the emitter of the third BJT B3 is electrically connected with the fourth terminal 201 of the second transistor T2. In an embodiment, the second BJT B2 and the third BJT B3 are for example but not limited to be contained in a 6-pin SOT-363 package or in two 3-pin SOT-23 packages respectively Preferably but not exclusively, the first transistor T1 and the second transistor T2 are FETs or BJTs. In an embodiment, as shown in FIGS. 1, 4, 5 and 6, the first transistor T1 and the second transistor T2 are FETs. Under this circumstance, the first terminal 101, the second terminal 102 and the third terminal 103 are a source, a gate and a drain of the first transistor T1 respectively, and the fourth terminal 201, the fifth terminal 202 and the sixth terminal 203 are a source, a gate and a drain of the second transistor T2 respectively. Alternatively, in an embodiment, as shown in FIGS. 7 and 8, the first transistor T1 and the second transistor T2 are BJTs. Under this circumstance, the first terminal 101, the second terminal 102 and the third terminal 103 are an emitter, a base and a collect of the first transistor T1 respectively, and the fourth terminal 201, the fifth terminal 202 and the sixth terminal 203 are an emitter, a base and a collect of the second transistor T2 respectively.

From the above descriptions, the present disclosure provides an ORing circuit. An ORing FET of the ORing circuit is connected between an input port and an output port of the ORing circuit, thus the current between the input port and output port is controlled by changing the state of the ORing FET. In addition, the ORing FET operates in a nonlinear mode. When the output current loading is at heavy load, the drain-source resistance of the ORing FET is low, which causes high efficiency on power transmission. When the output current loading is at no/light load, the drain-source resistance of the ORing FET is high, which causes low negative current flowing back to the ORing FET. Therefore, the negative current is limited by the high drain-source resistance of the ORing FET when the output voltage is higher than the input voltage. Furthermore, when the input port is shorted to ground, the comparing circuit turns off the ORing FET immediately to protect the output voltage from going to out of regulation.

While the disclosure has been described in terms of what is presently considered to be the most practical and preferred embodiments, it is to be understood that the disclosure needs not be limited to the disclosed embodiment.

What is claimed is:
1. An ORing circuit comprising:
an input port for receiving an input voltage;
an output port for outputting an output voltage;
an ORing FET (field effect transistor) electrically connected between the input port and the output port and comprising a source, a gate and a drain, wherein the source of the ORing FET is electrically connected with the input port, and the drain of the ORing FET is electrically connected with the output port;
a comparing circuit electrically connected with the input port and the gate of the ORing FET;
a first transistor comprising a first terminal, a second terminal and a third terminal, wherein the first terminal is directly connected with the input port and the source of the ORing FET, and the third terminal is electrically connected with the gate of the ORing FET; and
a second transistor comprising a fourth terminal, a fifth terminal and a sixth terminal, wherein the fourth terminal is electrically connected with the output port and the drain of the ORing FET, the fifth terminal is directly connected to the sixth terminal, and the sixth terminal is electrically connected with the second terminal of the first transistor.

2. The ORing circuit according to claim 1, wherein the comparing circuit comprises a comparator, a first resistance and a second resistance, the comparator comprises an inverting input, a non-inverting input and an output, the inverting input is electrically connected with one terminal of the first resistance, the other terminal of the first resistance is electrically connected with the output port and the drain of the ORing FET, the non-inverting input is electrically connected with one terminal of the second resistance, the other terminal of the second resistance is electrically connected with the input port, and the output is electrically connected with the gate of the ORing FET.

3. The ORing circuit according to claim 2, wherein the comparing circuit further comprises a second capacitance, a third capacitance, a third diode, a fourth diode, a ninth resistance and a tenth resistance, two terminals of the second capacitance are electrically connected with the inverting input and the non-inverting input of the comparator respectively, the third diode is connected with the fourth diode in series, an anode pin of the third diode is electrically connected with the input port, a cathode pin of the fourth diode is electrically connected with the inverting input of the comparator, one terminal of the ninth resistance is electrically connected with the inverting input of the comparator, the other terminal of the ninth resistance is grounded, one terminal of the tenth resistance is electrically connected with a cathode pin of the third diode and an anode pin of the fourth diode, the other terminal of the tenth resistance is grounded, and the third capacitance is connected with the tenth resistance in parallel.

4. The ORing circuit according to claim 1, wherein the comparing circuit comprises a first BJT (bipolar junction transistor) and a first capacitance, the first capacitance is grounded and connected with a resistance in parallel, the first BJT comprises a collect, a base and an emitter, the collect of the first BJT is electrically connected with the gate of the ORing FET, the base of the first BJT is electrically connected with the first capacitance, and the emitter of the first BJT is electrically connected with the input port.

5. The ORing circuit according to claim 4, wherein the comparing circuit further comprises a fifth diode, an anode pin of the fifth diode is electrically connected with the input port and the emitter of the first BJT, and a cathode pin of the fifth diode is connected with the base of the first BJT.

6. The ORing circuit according to claim 1, wherein the first transistor and the second transistor are FETs, the first terminal, the second terminal and the third terminal are a source, a gate and a drain of the first transistor respectively, and the fourth terminal, the fifth terminal and the sixth terminal are a source, a gate and a drain of the second transistor respectively.

7. The ORing circuit according to claim 1, wherein the first transistor and the second transistor are BJTs, the first terminal, the second terminal and the third terminal are an emitter, a base and a collect of the first transistor respectively, and the fourth terminal, the fifth terminal and the sixth terminal are an emitter, a base and a collect of the second transistor respectively.

8. The ORing circuit according to claim 1, wherein the first transistor and the second transistor are contained in a 6-pin SOT-363 package or in two 3-pin SOT-23 packages respectively.

9. The ORing circuit according to claim 1, further comprising a second BJT and a third BJT, wherein the second BJT comprises a collect, a base and an emitter, the collect of the second BJT is electrically connected with the input port and the source of the ORing FET, the base of the second BJT is connected to the emitter of the second BJT, the emitter of the second BJT is electrically connected with the first terminal of the first transistor, wherein the third BJT comprises a collect, a base and an emitter, the collect of the third BJT is electrically connected with the output port and the drain of the ORing FET, the base of the third BJT is connected to the emitter of the third BJT, and the emitter of the third BJT is electrically connected with the fourth terminal of the second transistor.

10. The ORing circuit according to claim 9, wherein the second BJT and the third BJT are contained in a 6-pin SOT-363 package or in two 3-pin SOT-23 packages respectively.

11. The ORing circuit according to claim 1, further comprising a first diode and a third resistance, wherein an anode pin of the first diode is electrically connected with the third terminal of the first transistor, a cathode pin of the first diode is electrically connected with one terminal of the third resistance, and the other terminal of the third resistance is electrically connected with the gate of the ORing FET.

12. The ORing circuit according to claim 1, further comprising a fourth resistance, wherein one terminal of the fourth resistance is electrically connected with the input port and the source of the ORing FET, and the other terminal of the fourth resistance is electrically connected with the gate of the ORing FET.

13. The ORing circuit according to claim 1, further comprising a bias port configured to receive a bias voltage.

14. The ORing circuit according to claim 13, further comprising a fifth resistance, wherein one terminal of the fifth resistance is electrically connected with third terminal of the first transistor, and the other terminal of the fifth resistance is electrically connected with the bias port.

15. The ORing circuit according to claim 13, further comprising a sixth resistance and a seventh resistance, wherein one terminal of the sixth resistance is electrically connected with the bias port, the other terminal of the sixth resistance is electrically connected with one terminal of the seventh resistance and the sixth terminal of the second transistor, and the other terminal of the seventh resistance is electrically connected with the second terminal of the first transistor.

16. The ORing circuit according to claim 13, further comprising a second diode and an eighth resistance, wherein an anode pin of the second diode is electrically connected with the output port, the drain of the ORing FET and the fourth terminal of the second transistor, a cathode pin of the second diode is electrically connected with one terminal of the eighth resistance, and the other terminal of the eighth resistance is electrically connected with the bias port.

17. The ORing circuit according to claim 1, wherein the input port is electrically connected with a power supply unit, and the output port is electrically connected with a system bus.

* * * * *